(12) United States Patent
Kao et al.

(10) Patent No.: US 12,148,471 B2
(45) Date of Patent: Nov. 19, 2024

(54) RECONFIGURABLE COMPUTATIONAL MEMORY DEVICE, OPERATION METHOD OF THE RECONFIGURABLE COMPUTATIONAL MEMORY DEVICE AND SEMICONDUCTOR DIE INCLUDING THE RECONFIGURABLE COMPUTATIONAL MEMORY DEVICE

(71) Applicant: Taiwan Semiconductor Manufacturing Company, Ltd., Hsinchu (TW)

(72) Inventors: Yun-Feng Kao, New Taipei (TW); Katherine H Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 172 days.

(21) Appl. No.: 17/892,130

(22) Filed: Aug. 22, 2022

(65) Prior Publication Data

US 2024/0062817 A1   Feb. 22, 2024

(51) Int. Cl.
*G11C 11/00*   (2006.01)
*G11C 13/00*   (2006.01)

(52) U.S. Cl.
CPC ...... *G11C 13/0069* (2013.01); *G11C 13/0038* (2013.01); *G11C 13/004* (2013.01); *G11C 2013/0054* (2013.01)

(58) Field of Classification Search
CPC ........... G11C 13/0069; G11C 13/0038; G11C 13/004; G11C 2013/0054; G11C 11/2259; G11C 11/2273; G11C 11/2275; G11C 13/0002; G11C 11/223; H03K 19/00
USPC ........................................................ 365/148
See application file for complete search history.

(56) References Cited

U.S. PATENT DOCUMENTS 11,482,282 B2 * 10/2022 Wang ................. G11C 13/0002
2019/0172539 A1 * 6/2019 Slesazeck ......... H01L 29/40111

* cited by examiner

*Primary Examiner* — Tha-O H Bui
(74) *Attorney, Agent, or Firm* — JCIPRNET

(57) ABSTRACT

A memory device, an operation method of a memory cell in a memory device and a semiconductor die are provided. A computational memory cell in the memory device includes: a field effect transistor (FET), with a changeable threshold voltage; and resistive storage devices, connected by a common terminal coupled to a source/drain terminal of the FET. By altering the threshold voltage of the FET, a logic function of the computational memory cell can be changed. During a logic operation, inputs are provided to the computational memory cell as resistance states of the resistive storage devices, and a current passing through a conduction channel of the FET is functioned as an output for the logic operation.

20 Claims, 14 Drawing Sheets

RECONFIGURABLE COMPUTATIONAL MEMORY DEVICE, OPERATION METHOD OF THE RECONFIGURABLE COMPUTATIONAL MEMORY DEVICE AND SEMICONDUCTOR DIE INCLUDING THE RECONFIGURABLE COMPUTATIONAL MEMORY DEVICE

BACKGROUND

With continually increasing amount of data generated each day, there is an ever greater need to store and process massive amount of data, and therefore a motivation to find improved ways of storing and processing data. Over the years, manufacturers and designers have worked to make memory arrays physically smaller but capable of storing greater amount of data. In addition, with advances in modern day semiconductor manufacturing processes, it is possible to process large quantities of data in a central processing unit (CPU) of a computing device. However, data bus transferring data between the CPU and the memory array has not increased at an equal space. As a consequence, the data bus become a bottleneck for further increasing speed of operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
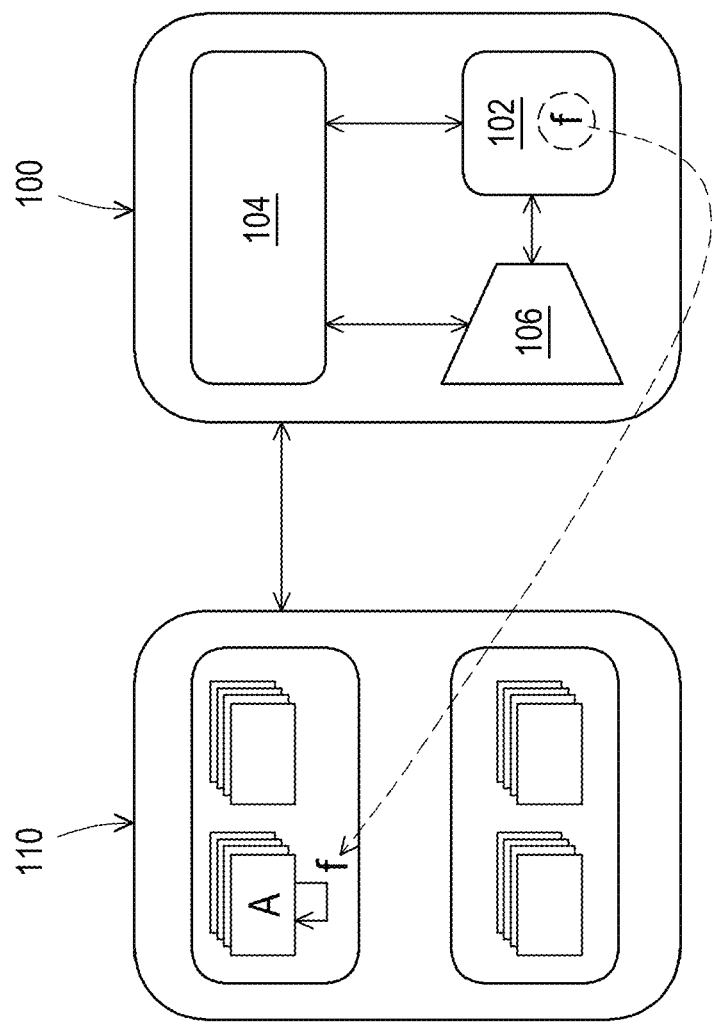
FIG. 1 is a block diagram illustrating a computation architecture according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram illustrating a computation architecture 10, according to some embodiments of the present disclosure.

Referring to FIG. 1, the computation architecture 10 is a non-Von Neumann architecture. As similar to a Von Neumann architecture, the computation architecture 10 may include a processor 100 and a memory module 110. The processor 100 may include an arithmetic logic unit 102, a control unit 104 and a cache 106. The arithmetic logic unit 102 allows arithmetic (add, subtract and so forth) and logic (AND, OR, NOT and so forth) operations to be carried out. The control unit 104 controls how the arithmetic logic unit 102, the memory module 110 and input/output devices (not shown) respond to program instructions the control unit 104 has received from the memory module 110. In addition, the control unit 104 may also provide timing and control signals required by other computer components. The cache 106 includes high speed storage devices. Data may be stored in the cache 106 before it can be processed.

As a difference from a Von Neumann architecture, computation is at least partly performed by exploiting physical attributes of the memory module 110 organized as a computational memory. In this way, when data "A" is stored in a memory cell of the memory module 30 and a function f(A) is instructed to be performed, the data "A" does not have to be brought to the arithmetic logic unit 102 in the processor 100. Rather, the memory module 110 can be operated to perform the function f(A). Therefore, data transfer between the memory module and the arithmetic logic unit 102, which may result in a serious performance bottleneck, can be significantly reduced. As compared to a Von Neumann architecture, data processing in the computation architecture 10 may be more efficient in terms of energy and latency.

Figure 2:
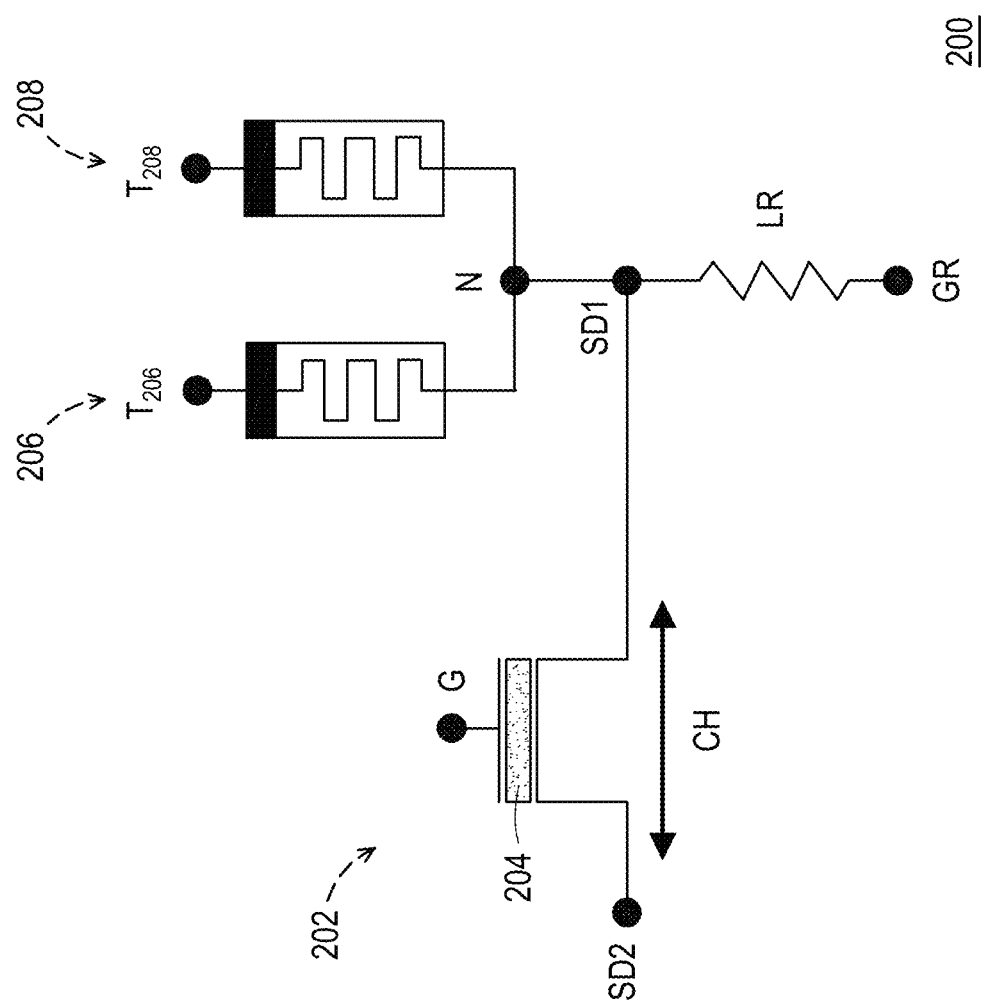
FIG. 2 is a schematic circuit diagram illustrating a memory cell in the memory module as shown in FIG. 1, according to some embodiments of the present disclosure.

FIG. 2 is a schematic circuit diagram illustrating a memory cell 200 in the memory module 110 as shown in FIG. 1, according to some embodiments of the present disclosure.

Referring to FIG. 2, the memory cell 200 capable of performing logic operations includes a ferroelectric field effect transistor (FET) 202. As similar to a metal-oxide-semiconductor FET (MOSFET), the ferroelectric FET 202 has a gate terminal G and a pair of source/drain terminals SD1, SD2. One of the source/drain terminals SD1, SD2 (e.g., the source/drain terminal SD1) is coupled to a reference voltage terminal GR, which is configured to receive a reference voltage, such as a ground voltage. In some embodiments, the source/drain SD1 is coupled to the reference voltage terminal GR through a load resistor LR. In addition, the other one of the source/drain terminals SD1, SD2 (e.g., the source/drain terminal SD2) is configured to receive a bias voltage. When a voltage difference between the gate terminal G and the source/drain terminal SD1 exceeds a threshold voltage of the ferroelectric FET 202, an electrical current path can be established along the conduction channel CH. On the other hand, when the voltage difference between the gate terminal G and the source/drain terminal SD1 does not reach the threshold voltage or falls below the threshold voltage, the electrical current path may be absent. Therefore, the conduction channel CH can be controlled by the gate terminal G.

As a difference from a MOSFET, the ferroelectric FET 202 employs a ferroelectric layer 204 as a gate dielectric layer. The ferroelectric layer 204 lies between the gate terminal G and the conduction channel CH, and can be programmed with a first polarization state and a second polarization state having a polarity opposite to a polarity of the first polarization state. By switching polarization state of the ferroelectric layer 204, threshold voltage of the ferroelectric FET 202 can be altered. For instance, the ferroelectric FET 202 may have a relatively high threshold voltage when the ferroelectric layer 204 is programmed with the first polarization state, and may have a relatively low threshold voltage when the ferroelectric layer 204 is programmed with the second polarization state. Therefore, given that the voltage difference between the gate terminal G and the source/drain terminal SD1 is fixed, whether an electrical current path could be established along the conduction channel CH can be determined by the polarization state of the ferroelectric layer 204. Outputs of the logic operations performed by the memory cell 200 can be obtained by measuring electrical current passing through the conduction channel CH. As will be described in greater details, which logic function assigned to the memory cell 200 can be determined by the polarization state of the ferroelectric FET 202. Moreover, since the polarization state of the ferroelectric FET 202 can be switched, the memory cell 200 is reconfigurable. In other words, by changing the polarization state of the ferroelectric FET 202, the memory cell 200 can perform different logic functions.

In addition to the ferroelectric FET 202, the memory cell 200 further includes resistive storage devices 206, 208. The resistive storage devices 206, 208 are connected by a common terminal N, which is connected to the source/drain terminal SD1 of the ferroelectric FET 202. As such, the source/drain terminal SD1 is coupled to the reference voltage terminal GR (through the load resistor LR), and also coupled to the common terminal N of the resistive storage devices 206, 208. The resistive storage devices 206, 208 are respectively a two-terminal device, and each can be programmed with and switched between multiple resistance states. The resistive storage device 206 can be programmed by controlling a voltage difference between the common terminal N and a terminal $T_{206}$. Similarly, the resistive storage device 208 can be programmed by controlling a voltage difference between the common terminal N and a terminal $T_{208}$. Further, the resistance state(s) stored in the resistive storage devices 206, 208 remain even after the applied voltage is removed. In other words, the resistive storage devices 206, 208 are non-volatile resistive storage devices. As examples, the resistive storage devices 206, 208 may respectively be a resistive random access memory (RRAM), a phase change random access memory (PCRAM), a conductive-bridging random access memory (CBRAM) or a magnetoresistive random access memory (MRAM). It should be understood that, as being described so, each of the resistive storage devices 206, 208 is structurally identical to a storage unit in a RRAM, a PCRAM a CBRAM or a MRAM.

When voltages provided to the terminals $T_{206}$, $T_{208}$ are fixed, voltage at the common terminal N is dependent on the resistance states of the resistive storage devices 206, 208. Therefore, voltage at the source/drain terminal SD1 coupled to the common terminal N is affected by the resistance states of the resistive storage devices 206, 208. When both of the resistive storage devices 206, 208 are programmed with a high resistance state, the common terminal N (and therefore the source/drain terminal SD1) may be decoupled from the terminals $T_{206}$, $T_{208}$, and the voltage at the source/drain terminal SD1 is close to the reference voltage at the reference voltage terminal GR (e.g., a ground voltage). On the other hand, when both of the resistive storage devices 206, 208 are programmed with a low resistance state (that an equivalent resistance of the resistive storage devices 206, 208 is lower than a resistance of the load resistor LR), the voltage at the source/drain terminal SD1 may approximate a voltage provided to the terminals $T_{206}$, $T_{208}$. In addition, when one of the resistive storage devices 206, 208 is programmed with the high resistance state and the other is programmed with the low resistance state, the voltage at the source/drain terminal SD1 would be higher than the reference voltage at the reference voltage terminal GR, but lower than the voltage provided to the terminals $T_{206}$, $T_{208}$. As the voltage at the source/drain terminal SD1 varies with the resistance states of the resistive storage devices 206, 208, a voltage difference between the gate terminal G and the source/drain terminal SD1 of the ferroelectric FET 202 is also changed in corresponding to variation of the resistance states of the resistive storage devices 206, 208. Therefore, the electrical current along the conduction channel CH of the ferroelectric FET 202 is also affected by the resistance states of the resistive storage devices 206, 208.

The resistance states of the resistive storage devices 206, 208 are functioned as inputs for the logic operations performed by the memory cell 200. As an example, the low resistance state programmed in the resistive storage devices 206, 208 could be a logic high input signal (i.e., logic "1"), while the high resistance state programmed in the resistive storage devices 206, 208 could be a logic low input signal (i.e., logic "0"). On the other hand, as described above, outputs of the logic operations performed by the memory cell 200 can be obtained by measuring electrical current passing through the conduction channel CH. A relative high value of such electrical current may indicate a logic high output signal (i.e., logic "1"), whereas a relative low value of such electrical current may indicate a logic low output signal (i.e., logic "0"). Further, which logic function does the memory cell 200 perform can be determined by the polarization state of the ferroelectric FET 202.

Figure 3A:
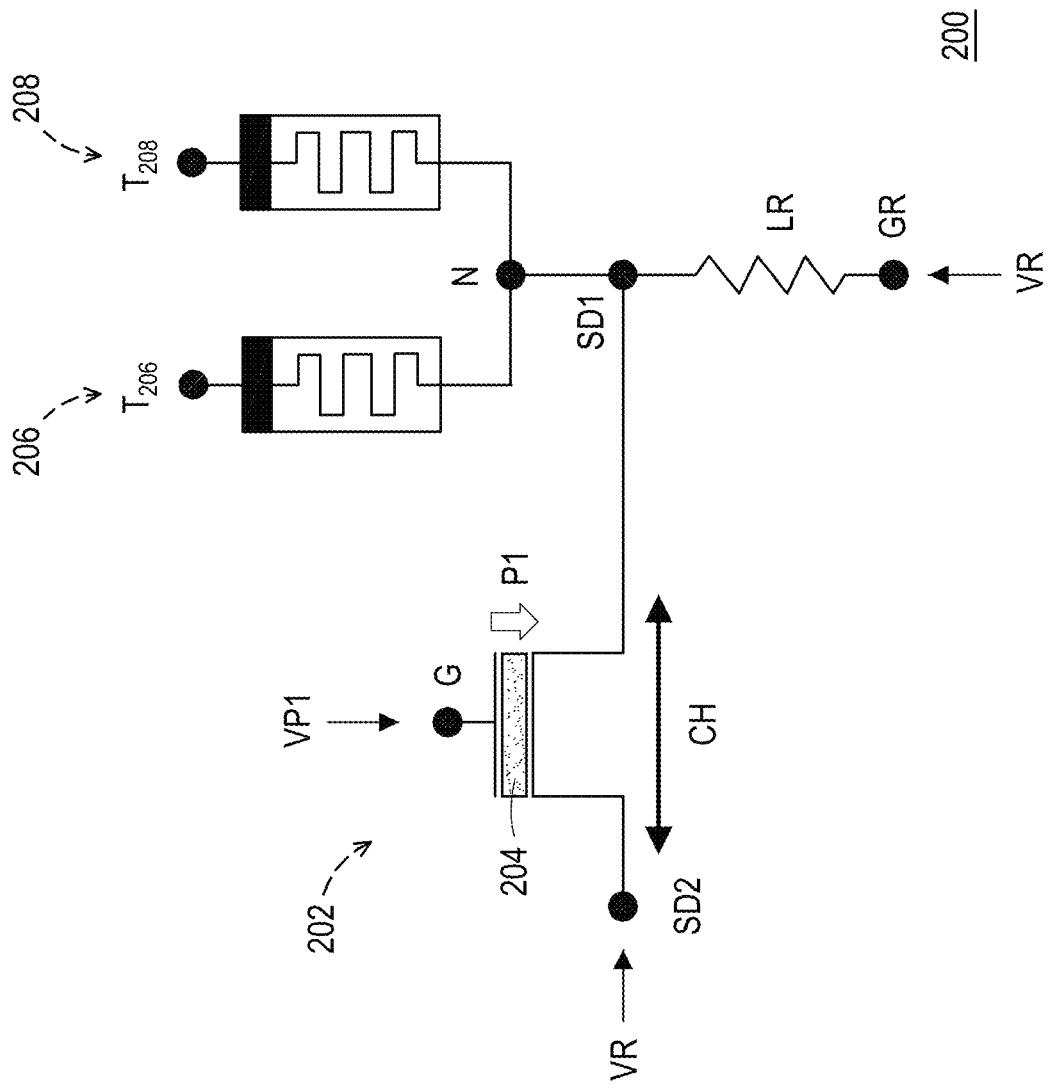
FIG. 3A is a schematic circuit diagram illustrating the memory cell during a programming operation for assigning a ferroelectric FET in the memory cell with a first polarization state, according to some embodiments of the present disclosure.

FIG. 3A is a schematic circuit diagram illustrating the memory cell 200 during a programming operation for assigning the ferroelectric FET 202 with a polarization state P1, according to some embodiments of the present disclosure.

Referring to FIG. 3A, during the programming operation for assigning the ferroelectric FET 202 with the polarization state P1, a programming voltage VP1 is provided to the gate terminal G of the ferroelectric FET 202. Meanwhile, in some embodiments, the source/drain terminals SD1, SD2 are respectively coupled to a reference voltage VR, such as a ground voltage. In addition, in some embodiments, the terminals $T_{206}$, $T_{208}$ of the resistive storage devices 206, 208 are electrically floated. In alternative embodiments, the terminals $T_{206}$, $T_{208}$ of the resistive storage devices 206. 208 are coupled to the reference voltage VR as well. In either case, a voltage at the source/drain terminal SD1 may approximate the reference voltage VR. The programming voltage VP1 is sufficiently high, such that a voltage applied across the ferroelectric layer 204 of the ferroelectric FET 202, which may be close to a difference between the programming voltage VP1 and the reference voltage VR, is great enough for polarizing the ferroelectric layer 204. As the ferroelectric layer 204 is programmed with the polarization state P1, the ferroelectric FET 202 may have a relatively low threshold voltage. Accordingly, the ferroelectric FET 202 can be turned on by a relatively low voltage difference between the gate terminal G and the source/drain terminal SD1. As will be further described, the memory cell 200 can be operated to perform a NAND operation when the ferroelectric FET 202 is programmed with the polarization state P1.

Figure 3B:
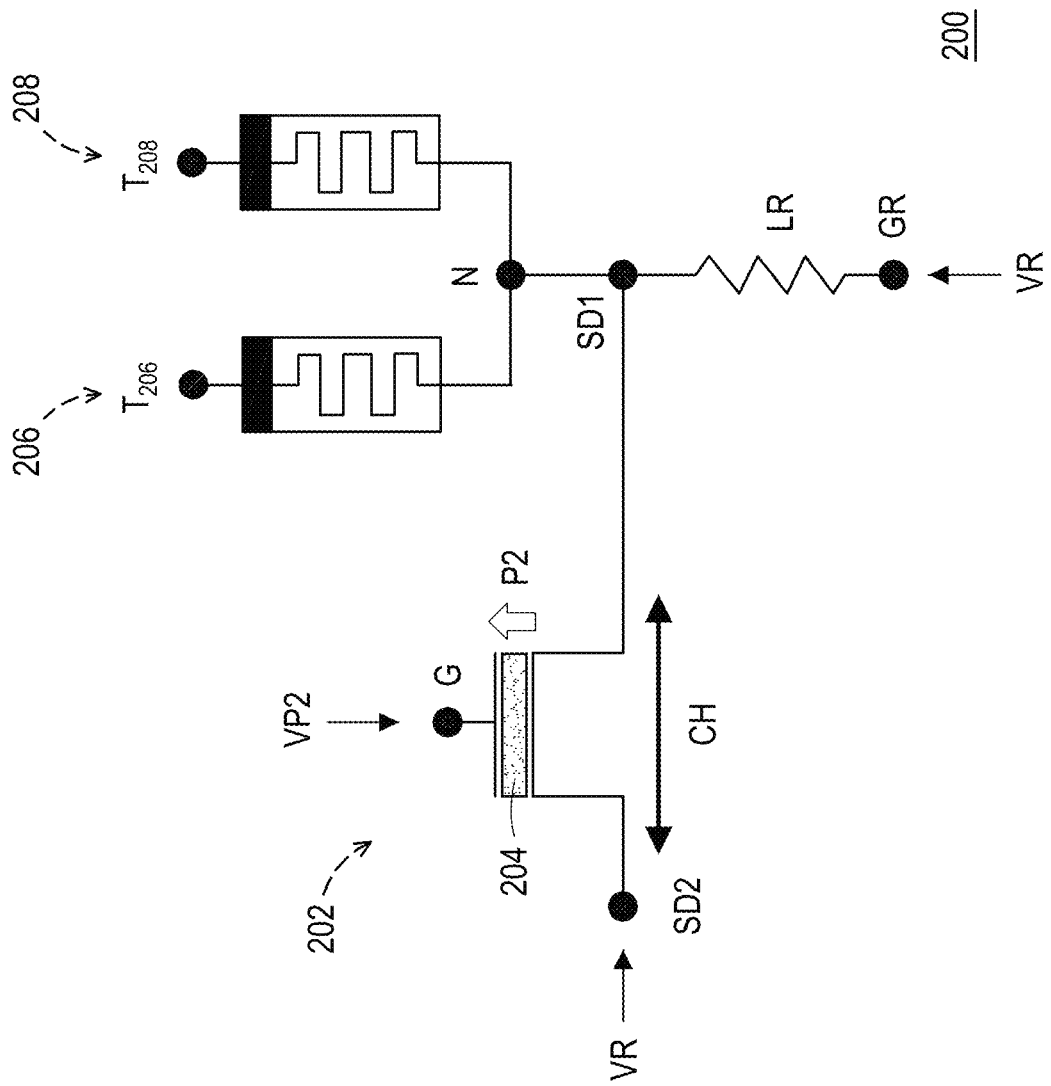
FIG. 3B is a schematic circuit diagram illustrating the memory cell during a programming operation for assigning a ferroelectric FET in the memory cell with a second polarization state, according to some embodiments of the present disclosure.

FIG. 3B is a schematic circuit diagram illustrating the memory cell 200 during a programming operation for assigning the ferroelectric FET 202 with a polarization state P2, according to some embodiments of the present disclosure.

A programming scheme for assigning the polarization state P2 to the ferroelectric FET 202 is similar to the programming scheme for assigning the polarization state P1 to the ferroelectric FET 202 described with reference to FIG. 3A, except that the gate terminal G of the ferroelectric FET 202 is configured to receive a programming voltage VP2 with a polarity opposite to a polarity of the programming voltage VP1 as shown in FIG. 3A. The resulting polarization state P2 in the ferroelectric layer 204 of the ferroelectric FET 202 has a polarity opposite to a polarity of the polarization state P1 as shown in FIG. 3A. As the ferroelectric layer 204 is programmed with the polarization state P2, the ferroelectric FET 202 may have a relatively high threshold voltage. Accordingly, a relatively high voltage difference between the gate terminal G and the source/drain terminal SD1 is required for turning on the ferroelectric FET 202. As will be further described, the memory cell 200 can be operated to perform a NOR operation when the ferroelectric FET 202 is programmed with the polarization state P2.

After the ferroelectric layer 204 of the ferroelectric FET 202 is programmed, a logic function of the memory cell 200 is determined. In order to operate the memory cell 200 for performing the logic function, inputs are provided to the memory cell 200. As described above, the inputs are provided as the resistance states of the resistive storage devices 206, 208.

Figure 4A:
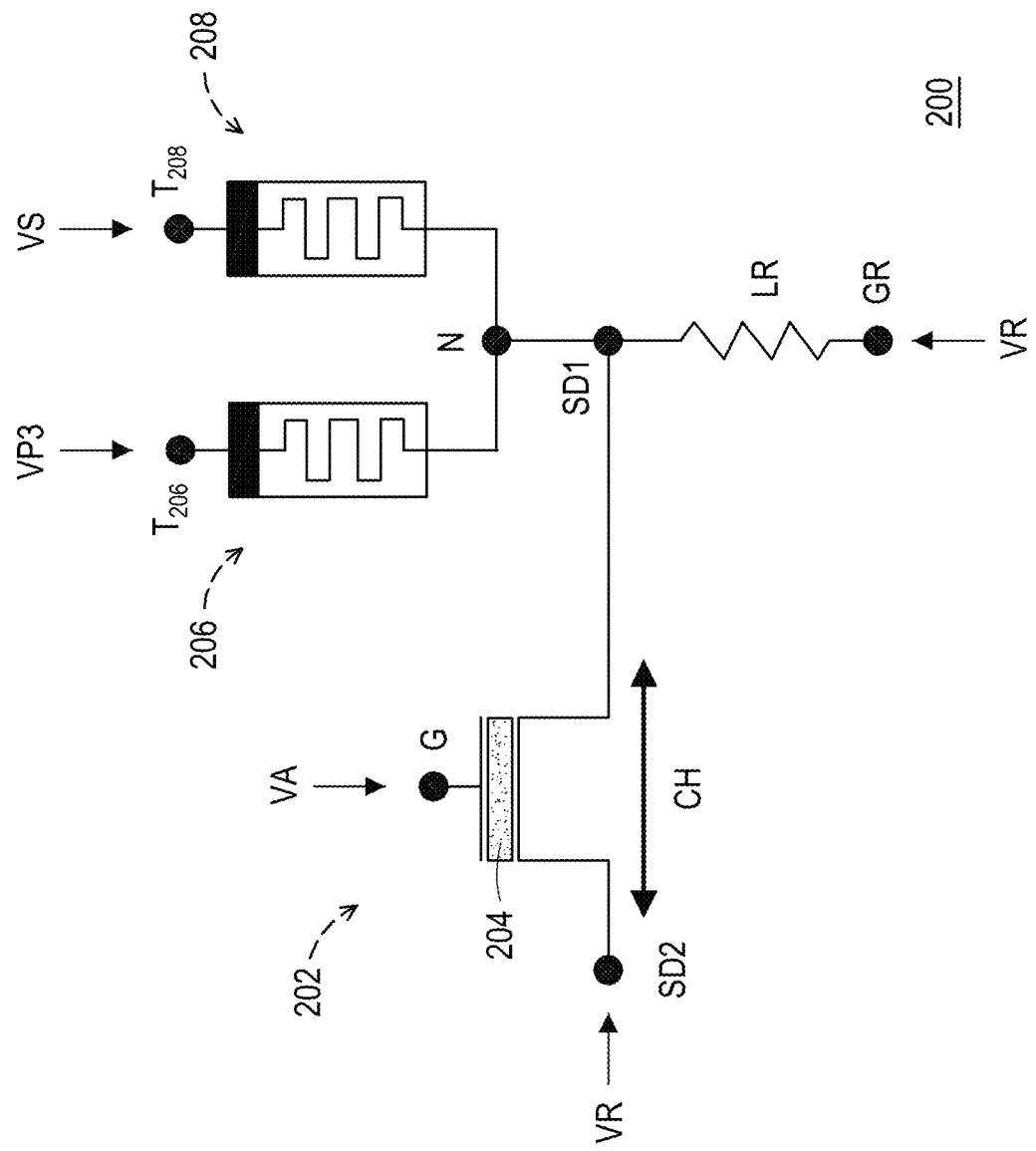
FIG. 4A and FIG. 4B are schematic circuit diagrams each illustrating the memory cell during a programming operation for assigning an input (i.e., a resistance state) to a resistive storage device in the memory cell, according to some embodiments of the present disclosure.
Figure 4B:
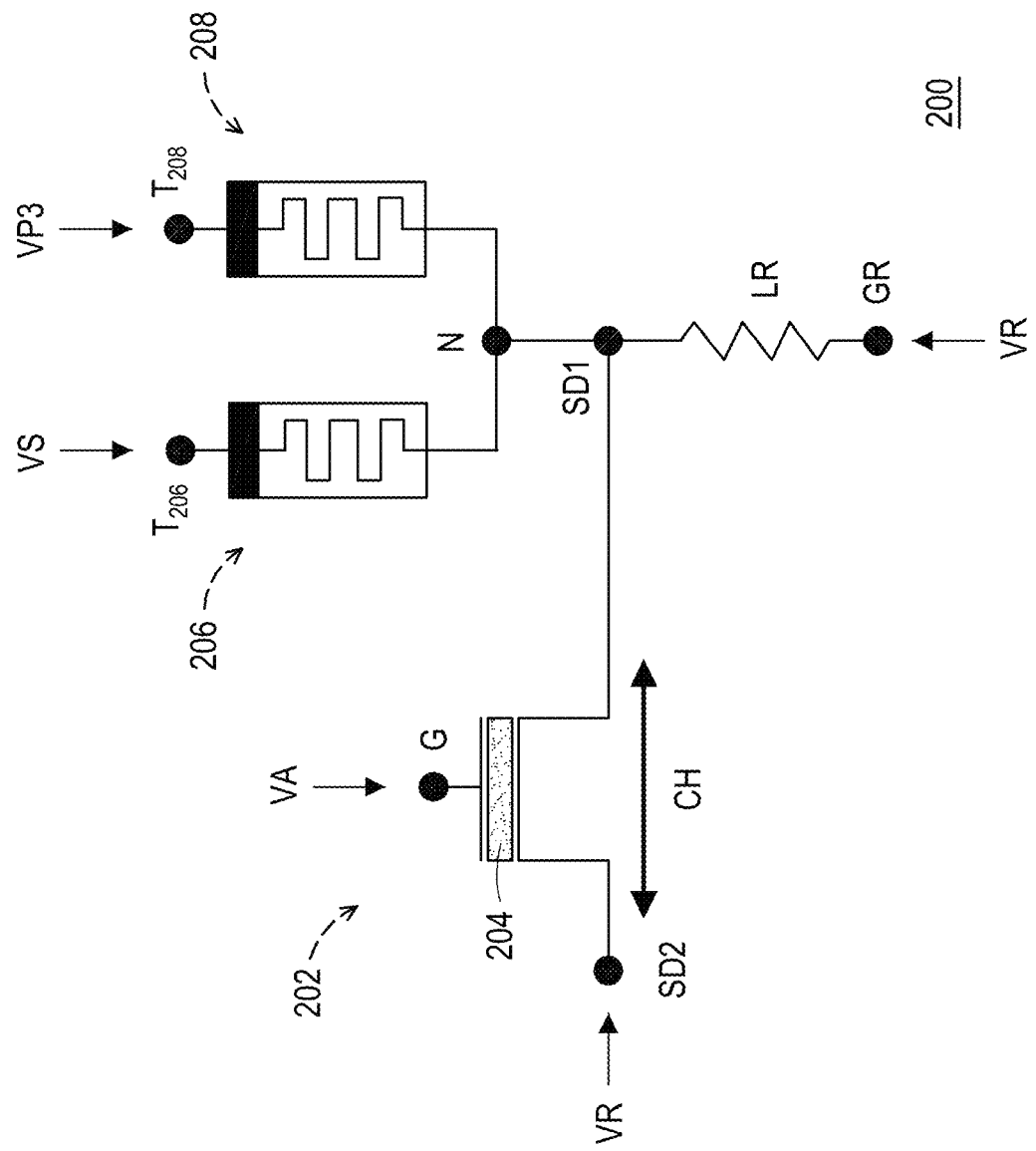

FIG. 4A and FIG. 4B are schematic circuit diagrams each illustrating the memory cell 200 during a programming operation for assigning an input (i.e., a resistance state) to one of the resistive storage devices 206, 208, according to some embodiments of the present disclosure.

Referring to FIG. 4A, in order to assign the resistive storage device 206 a resistance state (a high resistance state or a low resistance state), the terminal $T_{206}$ is configured to receive a write voltage VP3. In addition, the reference voltage terminal GR coupled to the other terminal N of the resistive storage device 206 may receive the reference voltage VR. The resistive storage device 206 can be programmed by a voltage difference between the terminal $T_{206}$ and the terminal N. Further, in some embodiments, the ferroelectric FET 202 is turned on by providing an assertion voltage VA to the gate terminal G of the ferroelectric FET 202. Meanwhile, the source/drain terminal SD2 of the ferroelectric FET 202 may be configured to receive the reference voltage VR. In these embodiments, current passing through the resistive storage device 206 may flow across the conduction channel CH of the ferroelectric FET 202, and is limited to a saturation current of the ferroelectric FET 202.

In some embodiments, the write voltage VP3 provided for programming the high resistance state may be different from the write voltage VP3 provided for programming the low resistance state, in terms of polarity, pulse width, magnitude or other parameters. Moreover, if the resistive storage device 208 is not subjected to programming, the terminal $T_{208}$ of the resistive storage device 208 may receive a pass voltage VS, such that a voltage difference between the terminal $T_{208}$ and the terminal N is insufficient for programming the resistive storage device 208.

Referring to FIG. 4B, a scheme for assigning a resistance state (a high resistance state or a low resistance state) to the resistive storage device 208 is similar to the programming scheme describe with reference to FIG. 4A, except that the write voltage VP3 is provided to the terminal $T_{208}$ and the pass voltage VS may be provided to the terminal $T_{206}$.

Respective schemes for programming the resistive storage devise 206, 208 are described. However, it should be understood that, the resistive storage devices 206, 208 can be programmed simultaneously. In this case, identical or different write voltage(s) VP3 may be provided to both of the terminals $T_{206}$, $T_{208}$ at the same time.

After the logic function of the memory cell 200 is determined by programming the ferroelectric FET 202 and the inputs are provided to the memory cell 200 as the resistance states of the resistive storage devices 206, 208, the memory cell 200 is subjected to a read operation for obtaining outputs of the logic function.

Figure 5A:
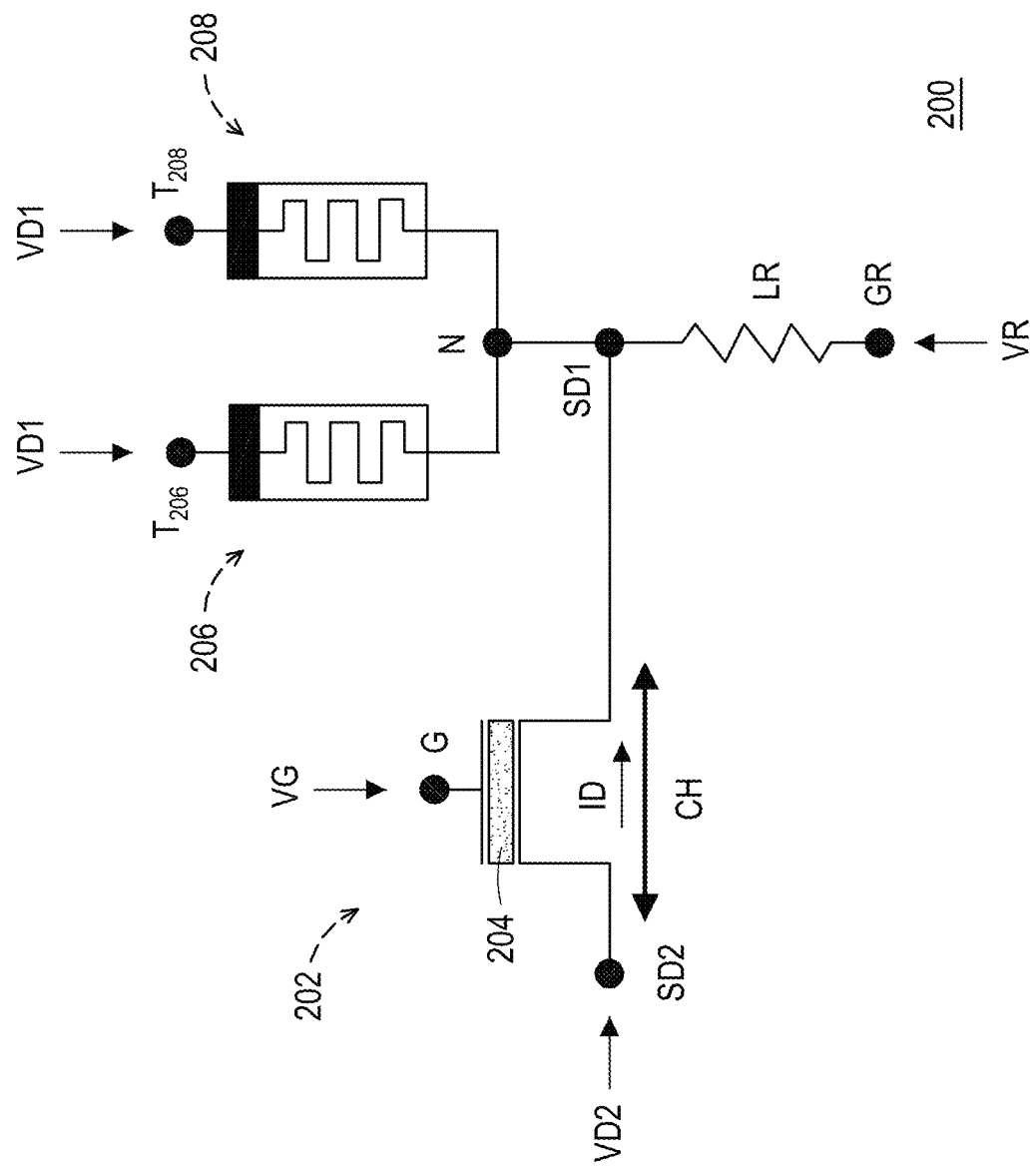
FIG. 5A is a schematic circuit diagram illustrating the memory cell under a read operation, according to some embodiments of the present disclosure.

FIG. 5A is a schematic circuit diagram illustrating the memory cell 200 under a read operation, according to some embodiments of the present disclosure.

Referring to FIG. 5A, in some embodiments, a power supply voltage VD1 is provided to both of the terminals $T_{206}$, $T_{208}$ of the resistive storage devices 206, 208 during a read operation. Meanwhile, the reference voltage terminal GR is coupled to the reference voltage VR. In addition, a gate voltage VG is provided to the gate terminal G of the ferroelectric FET 202, and a power supply voltage VD2 is provided to the source/drain terminal SD2 of the ferroelectric FET 202. In some embodiments, the power supply voltages VD1, VD2 and the gate voltage VG are positive voltages. Further, the power supply voltage VD1 may be identical with the power supply voltage VD2. Alternatively, the power supply voltage VD1 may be lower or higher than the power supply voltage VD2.

A voltage at the source/drain terminal SD1 and therefore a voltage difference between the gate terminal G and the source/drain terminal SD2 are dependent on the inputs (i.e., the resistances states) programmed to the resistive storage devices 206, 208. Given that a threshold voltage of the ferroelectric FET 202 has been pre-determined by the polarization state of the ferroelectric layer 204, switching of the ferroelectric FET 202 and therefore a current ID passing through the conduction channel CH of the ferroelectric FET 202 (i.e., the outputs of the logic operations performed by the memory cell 200) are controlled by such gate-to-source/drain voltage difference.

When both of the resistive storage devices 206, 208 are programmed with high resistance states (i.e., inputs of logic "0"), the source/drain terminal SD1 may be decoupled from the power supply voltage VD1, and the voltage at the source/drain terminal SD1 may approximate the reference voltage VR. Therefore, a large voltage difference between the gate terminal G and the source/drain terminal SD1 is resulted, and the ferroelectric FET 202 is ensured to be turned on. Accordingly, the current ID may have a large magnitude indicating an output of logic "1". On the other hand, when both of the resistive storage devices 206, 208 are programmed with low resistance states (i.e., inputs of logic "1"), the voltage at the source/drain terminal SD1 may be close to the power supply voltage VD1, and a small voltage difference between the gate terminal G and the source/drain terminal SD1 may be obtained. As such, the ferroelectric FET 202 is ensured to be in an off state, and the current ID may have a very small magnitude indicating an output of logic "0". Further, when one of the resistive storage devices 206, 208 is programmed with the high resistance state (i.e., the input logic "0") and the other is programmed with the low resistance state (i.e., the input logic "1"), an intermediate voltage difference between the gate terminal G and the source/drain terminal SD1 may be obtained. If the ferroelectric FET 202 is pre-programmed with a relatively low threshold voltage, the ferroelectric FET 202 may be turned on by the intermediate gate-to-source/drain voltage difference, and the current ID may have a large magnitude indicating the output of logic "1". If the ferroelectric FET 202 is pre-programmed with a relatively high threshold voltage, the ferroelectric FET 202 may not be turned on by the intermediate gate-to-source/drain voltage difference, such that the current ID may have a very small magnitude indicating the output of logic "0".

Figure 5B:
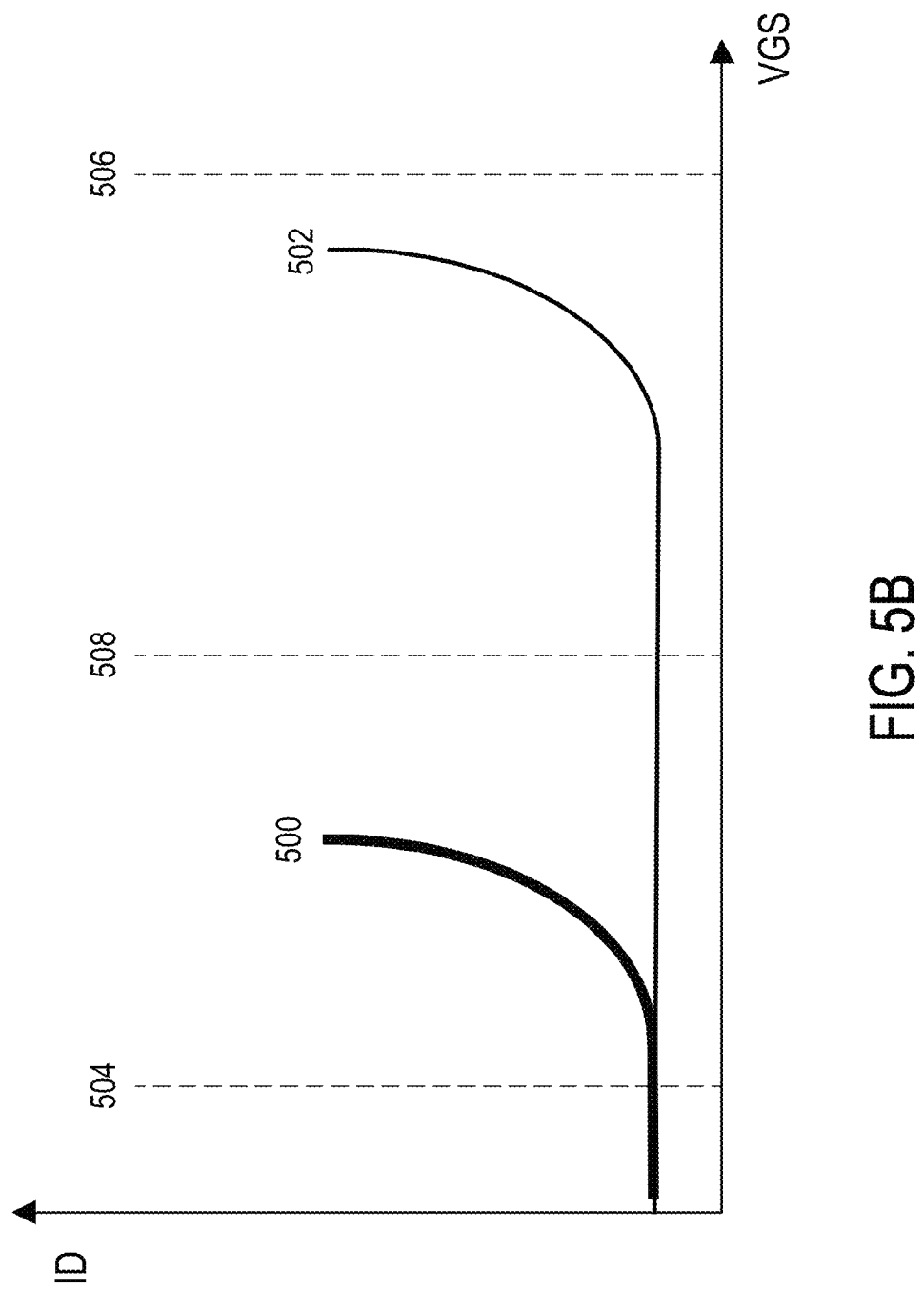
FIG. 5B is a plot diagram showing current-voltage curves of the ferroelectric FET programmed with different polarization states (i.e., different threshold voltages), according to some embodiments of the present disclosure.

FIG. 5B is a plot diagram showing current-voltage curves 500, 502 of the ferroelectric FET 202 programmed with different polarization states (i.e., different threshold voltages), according to some embodiments of the present disclosure.

A horizontal axis of the plot diagram shown in FIG. 5B indicates a voltage difference VGS between the gate terminal G and the source/drain terminal SD1 of the ferroelectric FET 202, while a vertical axis of the plot diagram shown in FIG. 5B indicates the current ID in corresponding to the sweeping voltage difference VGS. The curve 500 shows a switching behavior of the ferroelectric FET 202 while being programmed with a first polarization state and therefore having a low threshold voltage, while the curve 502 shows a switching behavior of the ferroelectric FET 202 while being programmed with a second polarization state and therefore having a high threshold voltage. Further, a vertical reference line 504 indicates a small magnitude of the voltage difference VGS, at which both of the resistive storage devices 206, 208 are programmed with the low resistance state (i.e., the input of logic "1"). A vertical reference line 506 indicates a large magnitude of the voltage difference VGS, at which both of the resistive storage devices 206, 208 are programmed with the high resistance state (i.e., the input of logic "0"). In addition, a vertical reference line 508 indicates an intermediate magnitude of the voltage difference VGS, at which one of the resistive storage devices 206, 208 is programmed with the low resistance state (i.e., the input of logic "0") and the other is programmed with the high resistance state (i.e., the input of logic "1").

As shown by the curve 500, the ferroelectric FET 202 is programmed to have a threshold voltage lower than the voltage difference VGS at the reference lines 506, 508. In other words, when the ferroelectric FET 202 is programmed to have the low threshold voltage, a large magnitude of the current ID (i.e., an output of logic "1") would be obtained if both of the resistive storage devices 206, 208 are programmed with the high resistance state (i.e., the input of logic "0"), or if one of the resistive storage devices 206, 208 is programmed with the high resistance state (i.e., the input of logic "0") while the other is programmed with the low resistance state (i.e., the input of logic "1"). On the other hand, the low threshold voltage indicated by the curve 500 is still higher than the voltage difference VGS at the reference line 504. As such, when ferroelectric FET 202 is programmed to have the low threshold voltage, a small magnitude of the current ID (i.e., an output of logic "0") would be obtained if both of the resistive storage devices 206, 208 are programmed with the low resistance state (i.e., the input of logic "1").

Combinations of the inputs and outputs (as logic "0" or logic "1") of the logic operation performed by the memory cell 200 having the ferroelectric FET 202 programmed to have the low threshold voltage are summarized in Table 1.

TABLE 1

| Input provided to the resistive storage device 206 | Input provided to the resistive storage device 208 | Output obtained by measuring the current ID |
| --- | --- | --- |
| 0 | 0 | 1 |
| 1 | 0 | 1 |
| 0 | 1 | 1 |
| 1 | 1 | 0 |

As shown in Table 1, the memory cell 200 as a logic gate produces an output which is false only if all of its inputs are true. In other words, a NAND operation can be performed by the memory cell 200 when the ferroelectric FET 202 in the memory cell 200 is programmed with the first polarization state and therefore having the low threshold voltage.

Referring to FIG. 5B again, as shown by the curve 502, the ferroelectric FET 202 is programmed to have a threshold voltage higher than the voltage difference VGS at the reference lines 504, 506. In other words, when the ferroelectric FET 202 is programmed to have the high threshold voltage, a small magnitude of the current ID (i.e., an output of logic "0") would be obtained if both of the resistive storage devices 206, 208 are programmed with the low resistance state (i.e., the input of logic "1"), or if one of the resistive storage devices 206, 208 is programmed with the low resistance state (i.e., the input of logic "1") while the other is programmed with the high resistance state (i.e., the input of logic "0"). On the other hand, the high threshold voltage indicated by the curve 502 is still lower than the voltage difference VGS at the reference line 506. As such, when ferroelectric FET 202 is programmed to have the high threshold voltage, a large magnitude of the current ID (i.e., an output of logic "1") would be obtained if both of the resistive storage devices 206, 208 are programmed with the high resistance state (i.e., the input of logic "0").

Combinations of the inputs and outputs (as logic "0" or logic "1") of the logic operation performed by the memory cell 200 having the ferroelectric FET 202 programmed to have the high threshold voltage are summarized in Table 2.

TABLE 2

| Input provided to the resistive storage device 206 | Input provided to the resistive storage device 208 | Output obtained by measuring the current ID |
|---|---|---|
| 0 | 0 | 1 |
| 0 | 1 | 0 |
| 1 | 0 | 0 |
| 1 | 1 | 0 |

As shown in Table 2, the memory cell 200 as a logic gate produces an output which is true only if all of its inputs are false. In other words, a NOR operation can be performed by the memory cell 200 when the ferroelectric FET 202 in the memory cell 200 is programmed with the second polarization state and therefore having the high threshold voltage.

Therefore, the memory cell 200 can perform NAND or NOR logic function, depending on the polarization state of the ferroelectric FET 202 in the memory cell 202. Further, since the polarization state of the ferroelectric FET 202 can be switched, the memory cell 200 is reconfigurable. Moreover, a plurality of the memory cells 200 configured to perform NAND logic function and a plurality of the memory cells 200 configured to perform NON logic function can be interconnected to generate any other logic function.

Figure 6A:
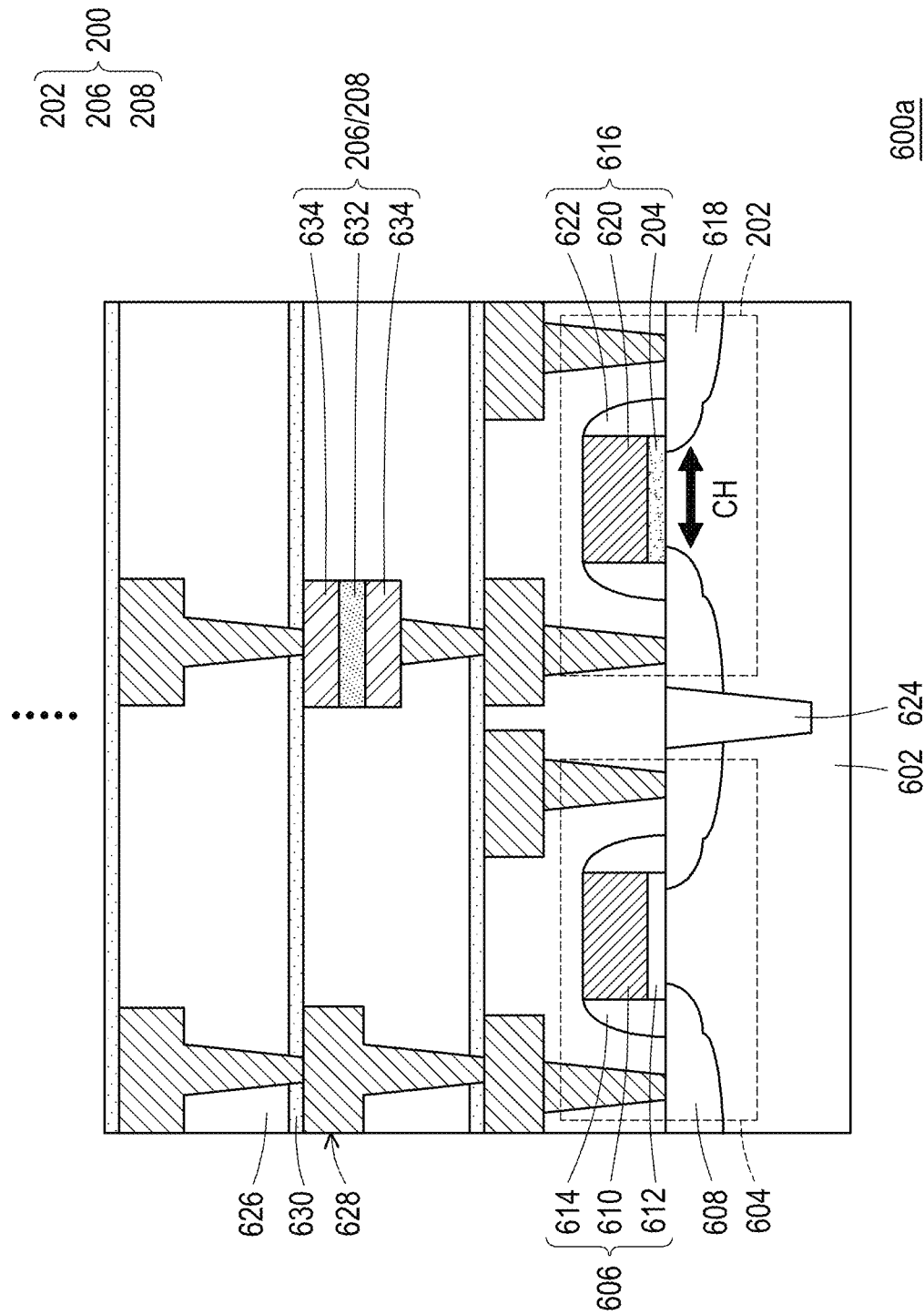
FIG. 6A is a schematic cross-sectional view illustrating a portion of a semiconductor die with the memory cells (only a single one is shown) embedded therein, according to some embodiments of the present disclosure.

FIG. 6A is a schematic cross-sectional view illustrating a portion of a semiconductor die 600a with the memory cells 200 (only a single one is shown) embedded therein, according to some embodiments of the present disclosure.

Referring to FIG. 6A, the semiconductor die 600a includes a semiconductor substrate 602. MOSFETs 604 (only a single one is shown) are formed on the semiconductor substrate 602, and can be interconnected to form a complementary-metal-oxide-semiconductor (CMOS) circuit. The MOSFETs 604 each include a gate structure 606 formed on the semiconductor substrate 602 and a pair of source/drain structures 608 at opposite sides of the gate structure 606. As shown in FIG. 6A, in some embodiments, a conduction channel in each MOSFET 604 is provided by a portion of the semiconductor substrate 602 covered by the gate structure 606 and spanning between the source/drain structures 608. In other embodiments, a conduction channel of each MOSFET 604 is provided by channel structures (not shown) wrapped by the gate structure 606 and extending between the source/drain structures 608. The gate structure 606 may include a gate electrode 610 and a gate dielectric layer 612 lying between the gate electrode 610 and the conduction channel. In some embodiments, the gate structure 606 further includes a sidewall spacer 614 covering sidewalls of the gate electrode 610 and the gate dielectric layer 612.

In some embodiments, the ferroelectric FET 202 in each memory cell 200 is also formed on the semiconductor substrate 602. As similar to the MOSFET 604, the ferroelectric FET 202 includes a gate structure 616 and a pair of source/drain structures 618 at opposite sides of the gate structure 616. A gate electrode 620 in the gate structure 616 is functioned as the gate terminal G of the ferroelectric FET 202, and the source/drain structures 618 are functioned as the source/drain terminals SD1, SD2 of the ferroelectric FET 202. As shown in FIG. 6A, in some embodiments, the conduction channel CH in each ferroelectric FET 202 is provided by a portion of the semiconductor substrate 602 covered by the gate structure 616 and spanning between the source/drain structures 618. In other embodiments, a conduction channel of each ferroelectric FET 202 is provided by channel structures (not shown) wrapped by the gate structure 616 and extending between the source/drain structures 618. In addition to the gate electrode 620, the gate structure 616 includes the ferroelectric layer 204 lying between the gate electrode 620 and the conduction channel CH, and may include a sidewall spacer 622 covering sidewalls of the gate electrode 620 and the ferroelectric layer 204.

An isolation structure 624 may be formed into the semiconductor substrate 602 for laterally separating adjacent ones of the MOSFETs 604 and the ferroelectric FETs 202. Moreover, the MOSFETs 604 and the ferroelectric FETs 202 may be covered by a stack of dielectric layers 626, and conductive features 628 are formed in the stack of dielectric layers 624 for routing the MOSFETs 604 and the ferroelectric FETs 202. In some embodiments, etching stop layers 630 respectively lie between adjacent ones of the dielectric layers 626. The conductive features 628 may include contact plugs standing on the source/drain structures 608, 618, and include conductive patterns and conductive vias distributed over the contact plugs. The conductive patterns provide lateral conduction paths, whereas the conductive vias provide vertical conduction paths.

The resistive storage devices 206, 208 in each memory cell 200 (only one of the resistive storage devices 206, 208 in a single memory cell 200 is shown) are embedded in the stack of dielectric layers 626. In each memory cell 200, both of the resistive storage devices 206, 208 are connected to the source/drain structure 618 functioned as the source/drain terminal SD1 of the ferroelectric FET 202 through the conductive features 628 in between. In some embodiments, each of the resistive storage devices 206, 208 includes a resistance variable layer 632 and a pair of electrodes 634 lying at opposite sides of the resistance variable layer 632. Suitable materials of the resistance variable layer 632 and the electrodes 634 may be selected according to the type of the resistive storage devices 206, 208. Further, locations of the resistive storage devices 206, 208 in the stack of dielectric layers 626 can be adjusted, according to process requirements and design needs.

As described with reference to FIG. 6A, in some embodiments, the ferroelectric FET 202 of the memory cell 200 can be provided by a front-end transistor. As will be described in greater details, the ferroelectric FET 202 can be alternatively provided by a back-end transistor.

Figure 6B:
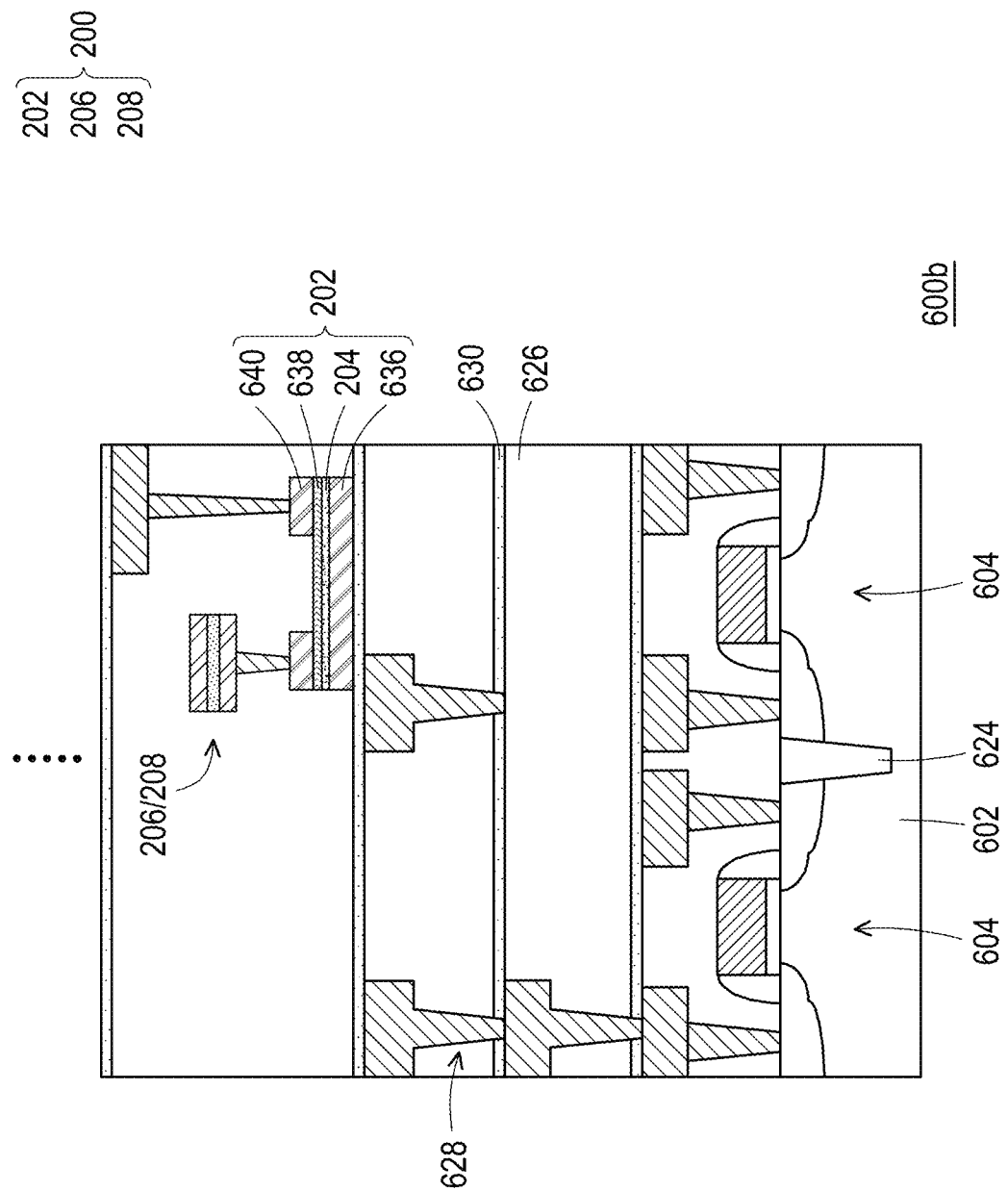
FIG. 6B is a schematic cross-sectional view illustrating a portion of a semiconductor die with the memory cells (only a single one is shown) embedded therein, according to some embodiments of the present disclosure.

FIG. 6B is a schematic cross-sectional view illustrating a portion of a semiconductor die 600b with the memory cells 200 (only a single one is shown) embedded therein, according to some embodiments of the present disclosure. The semiconductor die 600b is similar to the semiconductor die 600a as described with reference to FIG. 6A. For conciseness, only differences between the semiconductor dies 600a, 600b will be discussed, the same or the like parts of the semiconductor dies 600a, 600b would not be repeated again.

Referring to FIG. 6B, in some embodiments, the memory cells 200 (only a single one is shown) are entirely embedded in the stack of dielectric layers 626 covering the MOSFETs 604. In these embodiments, the ferroelectric FET 202 in each memory cell 200 is provided as a back-end transistor elevated from a front surface of the semiconductor substrate 602. As an example, the ferroelectric FET 202 can be formed with a bottom-gate configuration. In the ferroelectric FET 202 having the bottom-gate configuration, the ferroelectric layer 204 may be disposed on a gate electrode 636, and lie below a channel layer 638. In addition, source/drain structures 640 may be disposed on opposite ends of the channel layer 638. The gate electrode 636 is functioned as the gate terminal G of the ferroelectric FET 202, and the source/drain structures 640 are functioned as the source/drain terminals SD1, SD2 of the ferroelectric FET 202. Further, the gate electrode 636 and the source/drain structures 640 may be respectively formed of a conductive material, and the channel layer 638 may be formed of a semiconductor material, such as an oxide semiconductor material. Although not shown, the ferroelectric FET 202 as a back-end transistor can be formed with any other configuration, the present disclosure is not limited to the configuration of the ferroelectric FET 202.

The resistive storage devices 206, 208 (only one of the resistive storage devices 206, 208 is shown) in each memory cell 200 are disposed over and electrically connected to the source/drain structure 640 functioned as the source/drain terminal SD1 of the ferroelectric FET 202. Some of the conductive features 628 are used for connecting and routing the resistive storage devices 206, 208 and the ferroelectric FETs 202.

Since the memory cells 200 are elevated from the semiconductor substrate 602, valuable surface area of the semiconductor substrate 602 can be released. In some embodiments, the memory cells 200 overlap at least some of the MOSFETs 604 formed at the surface area of the semiconductor substrate 602.

Figure 7:
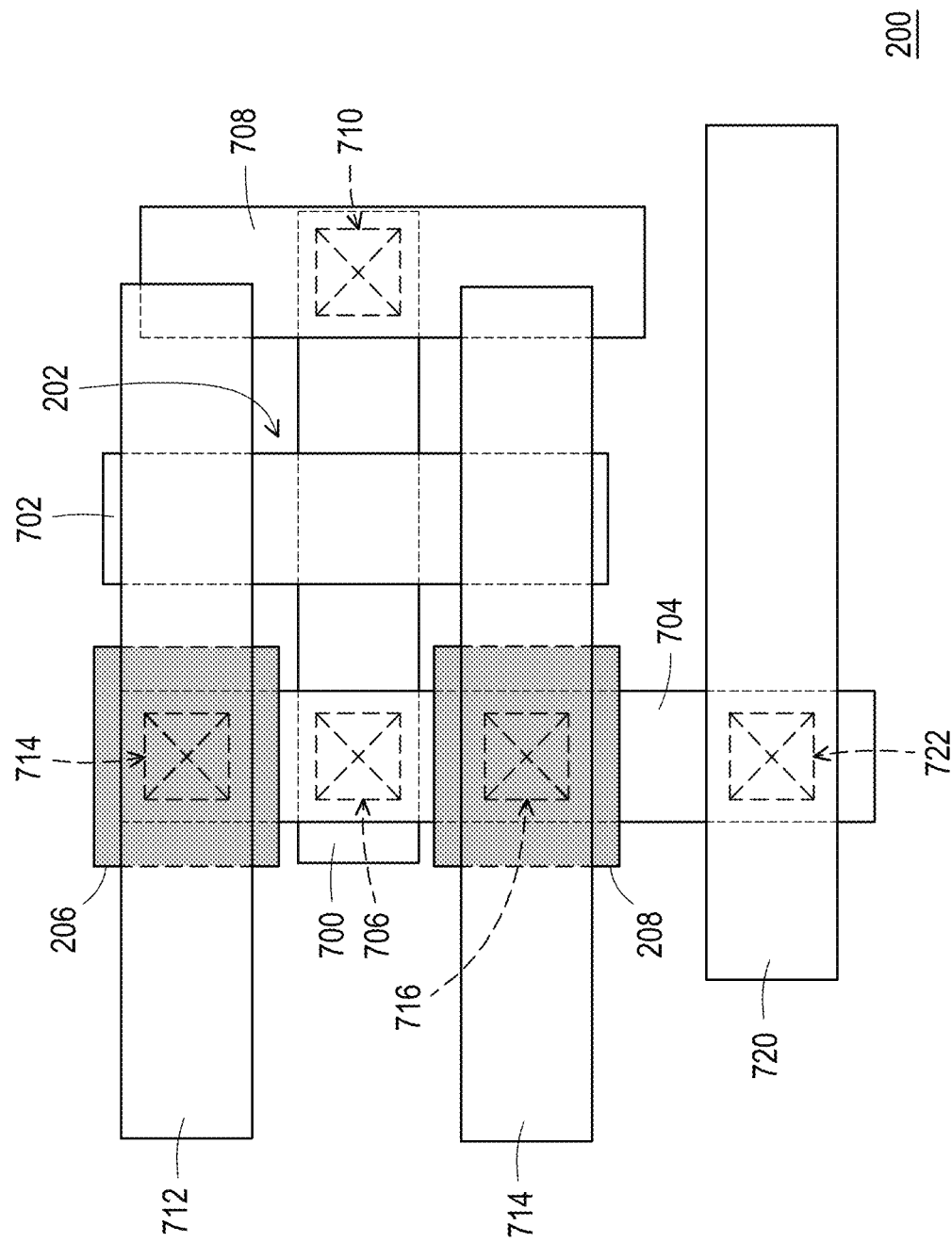
FIG. 7 is a schematic plan view illustrating a layout of the memory cell, according to some embodiments of the present disclosure.

FIG. 7 is a schematic plan view illustrating a layout of the memory cell 200, according to some embodiments of the present disclosure.

Referring to FIG. 7, the ferroelectric FET 202 is defined at an intersection of a channel strip 700 and a gate line 702. As shown in FIG. 7, according to some embodiments, the channel strip 700 may extend below the gate line 702. In these embodiments, the channel strip 700 may be a surface region of the semiconductor substrate 602 shown in FIG. 6A, and the gate line 702 may be the gate electrode 620 disposed on the semiconductor substrate 602. Alternatively, the channel strip 700 may extend above the gate line 702. In these alternative embodiments, the channel strip 700 may be the channel layer 638 as shown in FIG. 6B, and the gate line 702 may be the gate electrode 636 lying under the channel layer 638. In other embodiments, the channel strip 700 may laterally penetrate through the gate line 702. Further, although not shown, the ferroelectric layer 204 may lie between the channel strip 700 and the gate line 702.

Source/drain structures (not shown) of the ferroelectric FET 202 may be disposed at opposite ends of the channel strip 700. One of these source/drain structures is functioned as the source/drain terminal SD1 of the ferroelectric FET 202, and is connected to an overlying local interconnection line 704 through a conductive via 706. The interconnection line 704 may be the terminal N connected to the source/drain terminal SD1 and shared by the resistive storage devices 206, 208. In further embodiments, more conductive vias and conductive patterns (both not shown) are laid between the conductive via 706 and the local interconnection line 704. On the other hand, the other source/drain structure is functioned as the source/drain terminal SD2 of the ferroelectric FET 202, and is connected to a signal line 708 through a conductive via 710. The signal line 708 is configured to provide voltage signals to the source/drain terminal SD2.

The resistive storage devices 206, 208 are separately disposed on the local interconnection line 704, and are both electrically connected to the local interconnection line 704. As describe above, the local interconnection line 704 may be functioned as the terminal N shared by the resistive storage devices 206, 208. The other terminal of the resistive storage device 206 (i.e., the terminal $T_{206}$) may be connected to an overlying signal line 712 through a conductive via 714. Similarly, the other terminal of the resistive storage device 208 (i.e., the terminal $T_{208}$) may be connected to an overlying signal line 716 through a conductive via 718. The signal lines 712, 716 are configured to provide voltage signals to the resistive storage devices 206, 208.

Further, the local interconnection line 704 may be connected to a reference voltage line 720 through a conductive via 722. Where the local interconnection line 704 is connected to the conductive via 722 may be defined as the reference voltage terminal GR, and the reference voltage line 720 is configured to provide a reference voltage to the reference voltage terminal GR. In some embodiments, a section of the local interconnection line 704 between the conductive vias 706, 722 (i.e., between the source/drain terminal SD1 and the reference voltage terminal GR) may be functioned as the load resistor LR. In these embodiments, a length of such section of the local interconnection line 704 can be adjusted for altering resistance of the load resistor LR.

In some embodiments, the signal lines 712, 714 and the reference voltage line 720 are substantially parallel to the channel strip 700, whereas the local interconnection line 704 and the signal line 708 are substantially parallel to the gate line 702. However, extending directions of the signal lines 708, 712, 714, the local interconnection line 704 and the reference voltage line 720 can be altered, the present disclosure is not limited to arrangement of these conductive lines.

Figure 8A:
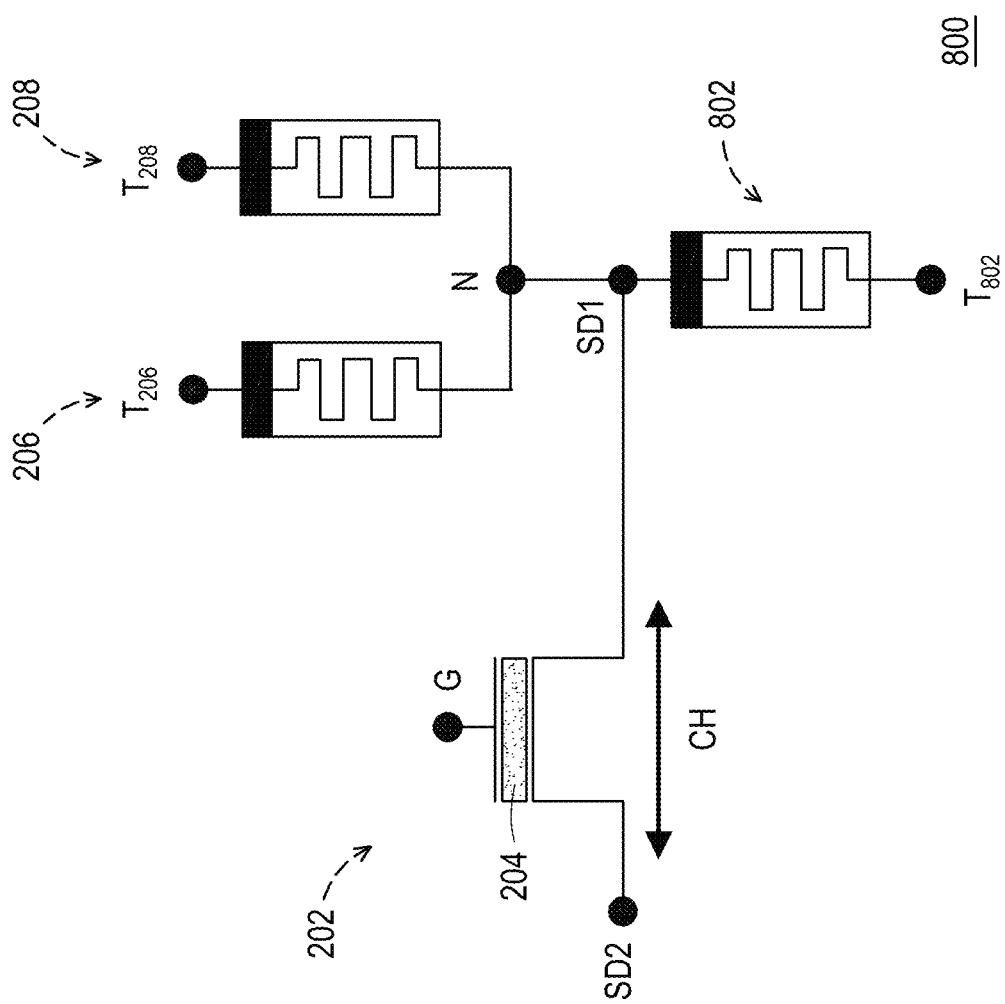
FIG. 8A is a schematic circuit diagram illustrating a memory cell, according to some other embodiments of the present disclosure.

FIG. 8A is a schematic circuit diagram illustrating a memory cell 800, according to some embodiments of the present disclosure. The memory cell 800 is similar to the memory cell 200 as described with reference to FIG. 2. For conciseness, only differences between the memory cells 200, 800 will be discussed. The same or the like parts of the memory cells 200, 800 would not be repeated again.

Referring to FIG. 8A, in some embodiments, the source/drain terminal SD1 of the ferroelectric FET 202 is connected to a terminal $T_{802}$ through a resistive storage device 802. During operations of the memory cell 800, a voltage difference between the source/drain terminal SD1 and the terminal $T_{802}$ can be controlled by a pre-programmed resistance state of the resistive storage device 802. As similar to each of the resistive storage devices 206, 208, the resistive storage device 802 is a two-terminal non-volatile resistive storage device. For instance, the resistive storage device 802 is structurally identical to a storage unit in a RRAM, a PCRAM a CBRAM or a MRAM. In some embodiments, programming of the resistive storage device 802 includes providing a write voltage to the terminal $T_{802}$; turning on the ferroelectric FET 202; and providing the reference voltage VR to the source/drain terminal SD2 and the terminals $T_{206}$, $T_{208}$. Once the resistive storage device 802 is programmed, the terminal $T_{802}$ may be coupled to the reference voltage VR, and a resistance state of the resistive storage device 802 may be fixed during operations of the memory cell 800.

Figure 8B:
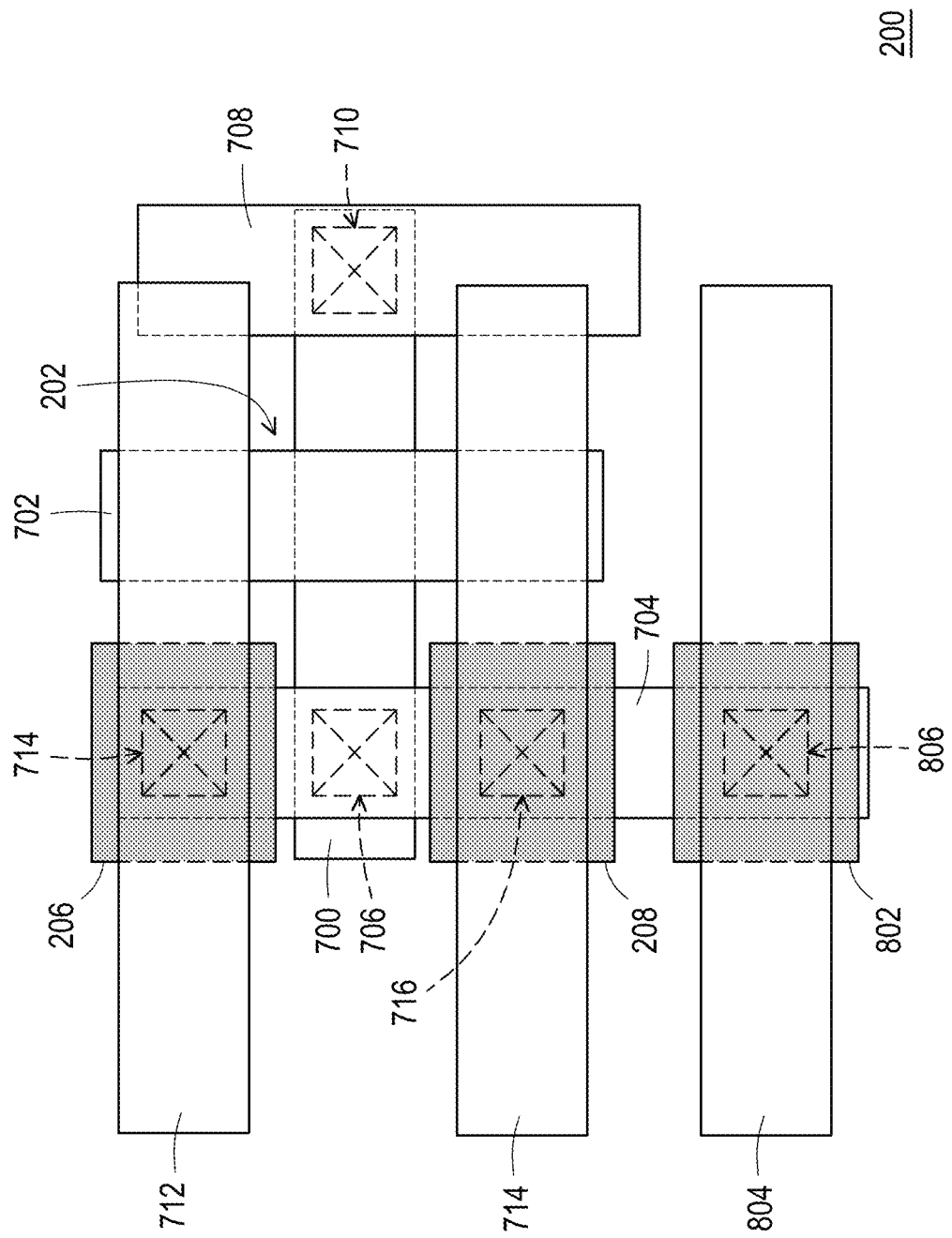
FIG. 8B is a schematic plan view illustrating a layout of the memory cell as shown in FIG. 8A, according to some embodiments of the present disclosure.

FIG. 8B is a schematic plan view illustrating a layout of the memory cell 800, according to some embodiments of the present disclosure. The layout of the memory cell 800 is similar to the layout of the memory cell 200 as described with reference to FIG. 7. For conciseness, only differences between the layouts of the memory cells 200, 800 will be discussed. The same or the like parts of theses layouts would not be repeated again.

Referring to FIG. 8, in some embodiments, the resistive storage device 802 is further disposed on the local interconnection line 704, and the local interconnection line 704 is connected to a signal line 804 through the resistive storage device 802 and a conductive via 806. The signal line 804 is configured to provide voltage signals to the resistive storage device 802. The terminal $T_{802}$ is defined by a terminal of the resistive storage device 802 connecting to the signal line 804 through the conductive via 806. A resistance between the terminal $T_{802}$ and the source/drain terminal SD1 (defined by the source/drain structure (not shown) routed by the conductive via 706) can be controlled by the resistance state of the resistive storage device 802. Therefore, excessively increasing a length of the local interconnection line 704 to meet the resistance requirement may no longer be needed.

Figure 9:
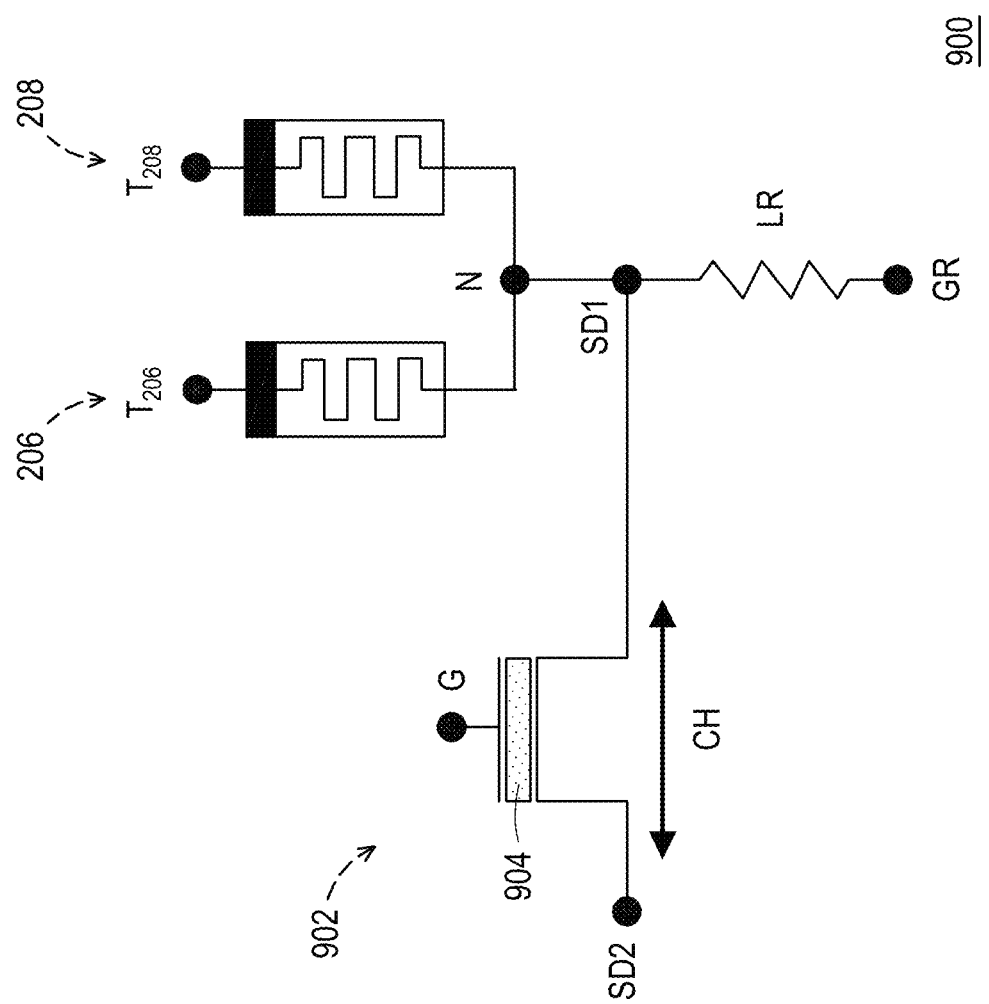
FIG. 9 is a schematic circuit diagram illustrating a memory cell, according to alternative embodiments of the present disclosure.

FIG. 9 is a schematic circuit diagram illustrating a memory cell 900, according to some embodiments of the present disclosure. The memory cell 900 is similar to the memory cell 200 as described with reference to FIG. 2. For conciseness, only differences between the memory cells 200, 900 will be discussed. The same or the like parts of the memory cells 200, 900 would not be repeated again.

A logic function of the memory cell 200 shown in FIG. 2 is determined by the polarization state of the ferroelectric FET 202. On the other hand, a logic function of the memory cell 900 shown in FIG. 9 is determined by charge insertion/removal of a charge trap FET 902. Charges inserted to and removal from the charge trap FET 902 may result in variation of a threshold voltage of the charge trap FET 902. As similar to the effect described with reference to FIG. 5B, table 1 and table 2, the memory cell 900 may be operated as a NAND gate when the trap charge FET 902 has a relatively low threshold voltage, and may be operated as a NOR gate when the trap charge FET 902 has a relatively high threshold voltage.

During programming of the charge trap FET 902, charges are inserted to and removed from a charge trapping layer 904 lying between the gate terminal G and the conduction channel CH of the charge trap FET 902. The charge trap FET 902 may have a high threshold voltage when charges are inserted to and trapped in the charge trapping layer 904, and have a low threshold voltage when the charges are removed from the charge trapping layer 904. In some embodiments, the charge trapping layer 904 includes a conductive charge trapping layer sandwiched between an insulating tunneling layer and a gate dielectric layer. In other embodiments, the charge trapping layer 904 includes an insulating charge trapping layer sandwiched between an insulating tunneling layer and a gate dielectric layer. In order to insert charges to the charge trapping layer 904, an assertion voltage is provided across the charge trapping layer 904 for turning on the charge trap FET 902, and charges traveling through the conduction channel CH between the source/drain terminals SD1, SD2 can be injected to and trapped in the charge trapping layer 904. In order to remove charges from the charge trap layer 904, an erase voltage having a polarity opposite to a polarity of the assertion voltage is provided across the charge trapping layer 904, such that the charges trapped in the charge trapping layer 904 can be depleted.

The memory cell 900 is structurally similar to the memory cell 200 as described with reference to FIG. 6A and FIG. 6B, except that the charge trapping layer 904 rather than the ferroelectric layer 204 is used in the gate structure of the charge trap FET 902 in the memory cell 900. In addition, the memory cell 900 can be formed with an arrangement identical with or similar to the arrangement as described with reference to FIG. 7.

As a variation to the memory cell 900, the load resistor LR in the memory cell 900 can be replaced by an additional resistive storage device similar to the resistive storage device 802 described with reference to FIG. 8A and FIG. 8B.

As above, a computation architecture including a memory module organized as a computational memory is provided. Since logic operations can be at least partly performed in the memory module, data transfer between a main arithmetic logic unit and the memory module in the computation architecture can be reduced. Therefore, the data transfer between the memory module and the main arithmetic logic unit may no longer result in serious performance bottleneck, and the computation architecture can be operated with improved efficiency. According to various embodiments, the memory cells in the memory module respectively include a FET and multiple resistive storage devices coupled to a source/drain terminal (e.g., a source terminal) of the FET. The FET, such as a ferroelectric FET or a charge trap FET, can be programmed with a low threshold voltage or a high threshold voltage, and a logic function of the memory cell is determined according to the threshold voltage of the FET. Since the threshold voltage of the FET can be altered, the logic function of the memory cell is changeable. In other words, the memory cell is reconfigurable. During a logic operation, inputs are provided as resistance states programmed to the resistive storage devices. A voltage at the source/drain terminal of the FET shared with the resistive storage devices is dependent on the resistance states of the resistive storage devices. Therefore, a gate-to-source voltage difference and thus switching of the FET can be affected by the resistance states of the resistive storage devices. An output of the logic operation can be obtained by sensing current passing through a conduction channel of the FET.

In an aspect of the present disclosure, a memory device is provided. The memory device comprises: computational memory cells, each configured to have a changeable logic function, and respectively comprising: a field effect transistor, with a changeable threshold voltage, wherein one of the computational memory cells is assigned with a first logic function as the field effect transistor in the one of the computational memory cells is programmed to have a low threshold voltage, and assigned with a second logic function as the field effect transistor in the one of the computational memory cells is programmed to have a high threshold voltage; and resistive storage devices, connected by a common terminal coupled to a source/drain terminal of the field effect transistor, wherein inputs for one of the computational memory cells are provided as resistance states of the resistive storage devices in the one of the computational memory cells, and a current passing through a conduction channel of the field effect transistor in the one of the computational memory cells is an output for the one of the computational memory cells.

In another aspect of the present disclosure, a method for operating a computational memory cell in a memory device is provided. The computational memory cell comprises a field effect transistor with a changeable threshold voltage and resistive storage devices coupled to a source/drain terminal of the field effect transistor. The method comprises: programming the field effect transistor with a low threshold voltage or a high threshold voltage, wherein the computational memory cell is assigned with a first logic function as the field effect transistor is programmed with the low threshold voltage and assigned with a second logic function as the field effect transistor is programmed with the high threshold voltage; and performing the assigned first or second logic function, comprising: setting inputs to the computational memory cell by programming the resistive storage devices; and performing a read operation, comprising obtaining an output by sensing a current passing through a conduction channel of the field effect transistor.

In yet another aspect of the present disclosure, a semiconductor die is provided. The semiconductor die comprises: computational memory cells, built on a semiconductor substrate, wherein the computational memory cells respectively comprise: a field effect transistor with a changeable threshold voltage, defined at an intersection of a channel strip and a gate line; a local interconnection line, electrically connected to a source/drain terminal of the field effect transistor; and first and second resistive storage devices, separately disposed on the local interconnection line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
computational memory cells, each configured to have a changeable logic function, and respectively comprising:
a field effect transistor, with a changeable threshold voltage, and defined at an intersection of a channel strip and a gate line, wherein one of the computational memory cells is assigned with a first logic function as the field effect transistor in the one of the computational memory cells is programmed to have a low threshold voltage, and assigned with a second logic function as the field effect transistor in the one of the computational memory cells is programmed to have a high threshold voltage; and
resistive storage devices, separately disposed on a local interconnection line coupled to a source/drain terminal of the field effect transistor, wherein inputs for one of the computational memory cells are provided as resistance states of the resistive storage devices in the one of the computational memory cells, and a current passing through a conduction channel of the field effect transistor in the one of the computational memory cells is an output for the one of the computational memory cells.

2. The memory device according to claim 1, wherein the first logic function is a NAND logic function, and the second logic function is a NOR logic function.

3. The memory device according to claim 1, wherein the field effect transistor is a ferroelectric field effect transistor with a ferroelectric layer lying between a gate terminal and the conduction channel.

4. The memory device according to claim 3, wherein the field effect transistor has the low threshold voltage as the ferroelectric layer is programmed with a first polarization state, and has the high threshold voltage as the ferroelectric layer is programmed with a second polarization state having a polarity opposite to a polarity of the first polarization state.

5. The memory device according to claim 1, wherein the field effect transistor is a charge trap field effect transistor with a charge trapping layer lying between a gate terminal and the conduction channel.

6. The memory device according to claim 5, wherein the field effect transistor has the high threshold voltage as charges are inserted into the charge trapping layer, and has the low threshold voltage as the charges are depleted from the charge trapping layer.

7. The memory device according to claim 1, wherein the resistive storage devices are respectively a resistive random access memory (RRAM), a phase change random access memory (PCRAM), a conductive-bridging random access memory (CBRAM) or a magnetoresistive random access memory (MRAM).

8. The memory device according to claim 1, wherein the source/drain terminal of the field effect transistor in each computational memory cell is further coupled to a reference voltage terminal through a load resistor.

9. The memory device according to claim 1, wherein the source/drain terminal of the field effect transistor in each computational memory cell is further coupled to an additional resistive storage device.

10. A method for operating a computational memory cell in a memory device, wherein the computational memory cell comprises a field effect transistor with a changeable threshold voltage and resistive storage devices coupled to a source/drain terminal of the field effect transistor, the field effect transistor is defined at an intersection of a channel strip and a gate line, the resistive storage devices are separately disposed on a local interconnection line coupled to the source/drain terminal of the field effect transistor, and the method comprises:
programming the field effect transistor with a low threshold voltage or a high threshold voltage, wherein the computational memory cell is assigned with a first logic function as the field effect transistor is programmed with the low threshold voltage and assigned with a second logic function as the field effect transistor is programmed with the high threshold voltage; and
performing the assigned first or second logic function, comprising:
setting inputs to the computational memory cell by programming the resistive storage devices; and
performing a read operation, comprising obtaining an output by sensing a current passing through a conduction channel of the field effect transistor.

11. The method for operating the computational memory cell in the memory device according to claim 10, wherein the source/drain terminal of the field effect transistor is further coupled to a reference voltage terminal.

12. The method for operating the computational memory cell in the memory device according to claim 10, wherein a gate voltage is provided to a gate terminal of the field effect transistor and power supply voltages are provided to the resistive storage devices as well as the other source/drain terminal of the field effect transistor during the read operation.

13. The method for operating the computational memory cell in the memory device according to claim 10, wherein the field effect transistor is turned on during programming of the resistive storage devices.

14. The method for operating the computational memory cell in the memory device according to claim 10, wherein programming the field effect transistor with the low threshold voltage or the high threshold voltage comprises programming a ferroelectric layer between a gate terminal and the conduction channel of the field effect transistor with a first polarization state or a second polarization state.

15. The method for operating the computational memory cell in the memory device according to claim 10, wherein programming the field effect transistor with the low threshold voltage or the high threshold voltage comprises inserting charges into a charge trapping layer between a gate terminal and the conduction channel of the field effect transistor or removing charges from the charge trapping layer.

16. A semiconductor die, comprising:
computational memory cells, built on a semiconductor substrate, wherein the computational memory cells respectively comprise:
a field effect transistor with a changeable threshold voltage, defined at an intersection of a channel strip and a gate line;
a local interconnection line, electrically connected to a source/drain terminal of the field effect transistor; and
first and second resistive storage devices, separately disposed on the local interconnection line.

17. The semiconductor die according to claim 16, wherein the field effect transistor is formed at a surface of the semiconductor substrate, and the local interconnection line as well as the first and second resistive storage devices are elevated from the surface of the semiconductor substrate.

18. The semiconductor die according to claim 16, wherein the field effect transistor as well as the first and second resistive storage devices are elevated from a surface of the semiconductor substrate.

19. The semiconductor die according to claim 16, wherein the local interconnection line in each computational memory cell is further connected to a reference voltage line.

20. The semiconductor die according to claim 16, wherein each computational memory cell further comprises a third resistive storage device disposed on the local interconnection line.

* * * * *